US006645859B1

(12) United States Patent
Sawada et al.

(10) Patent No.: US 6,645,859 B1
(45) Date of Patent: Nov. 11, 2003

(54) SEMICONDUCTOR DEVICE AND MANUFACTURING METHOD THEREOF

(75) Inventors: Mahito Sawada, Hyogo (JP); Hiroshi Tobimatsu, Hyogo (JP); Kouji Oda, Hyogo (JP); Yuuki Kamiura, Hyogo (JP); Kouji Shibata, Hyogo (JP); Hiroyuki Kawata, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 10/170,579

(22) Filed: Jun. 14, 2002

(30) Foreign Application Priority Data

Jan. 4, 2002 (JP) ......................................... 2002-000076

(51) Int. Cl.[7] .............................................. H01L 21/44
(52) U.S. Cl. ...................................... 438/680; 438/681
(58) Field of Search ................................ 438/197, 680, 438/681, 427, 700, 704, 723, 724, 756, 757, 758, 954

(56) References Cited

U.S. PATENT DOCUMENTS 6,037,018 A * 3/2000 Jang et al. .................. 427/579
6,090,714 A * 7/2000 Jang et al. .................. 438/692
6,242,303 B1 * 6/2001 Wang et al. ................ 438/257
6,248,673 B1 * 6/2001 Huang et al. ............... 438/787
6,350,672 B1 * 2/2002 Sun ............................ 438/619

FOREIGN PATENT DOCUMENTS

| JP | 11-154673 | 6/1999 |
| JP | 2001-118843 | 4/2001 |
| JP | 2001-176866 | 6/2001 |

* cited by examiner

*Primary Examiner*—David Nhu
(74) *Attorney, Agent, or Firm*—McDermott, Will & Emery

(57) ABSTRACT

A manufacturing method of a semiconductor device allowing successful filling of an insulating film by HDP-CVD (High Density Plasma-Chemical Vapor Deposition) in a gap or valley between densely placed interconnections is provided. The method includes the steps of forming semiconductor elements on a semiconductor substrate, forming on the semiconductor elements a plurality of interconnections with top protective layers side by side to electrically connect the semiconductor elements, forming a protective insulating film by CVD other than HDP-CVD to cover top and side surfaces of the interconnections and a bottom surface of a gap between the interconnections, and forming an insulating film by HDP-CVD to cover the protective insulating film and to fill in the gap between the interconnections covered with the protective insulating film.

6 Claims, 4 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof which allow successful gap filling with an insulating film between interconnections placed for electrically connecting semiconductor elements on a semiconductor substrate, and further prevent cracking or chipping of the interconnections that would otherwise occur when filling the insulating film.

2. Description of the Background Art

In a semiconductor device, interconnections, especially aluminum interconnections, are used for electrically connecting semiconductor elements formed on a semiconductor substrate with each other. In the semiconductor devices of recent years having narrow gaps or valleys between the interconnections, chemical vapor deposition utilizing high-density plasma (hereinafter, HDP-CVD: High Density Plasma-Chemical Vapor Deposition) is employed for formation of an insulating film to fill in the gaps between the interconnections.

FIG. 7 is a cross sectional view showing aluminum interconnections 103 in a conventional semiconductor device, that are placed on an interlayer insulating film 101 formed on a semiconductor substrate. Referring to FIG. 7, a Ti/TiN film 102 is formed beneath aluminum interconnection 103 as its under layer. Formed on aluminum interconnection 103 is a Ti/TiN film 104 as its top layer. The top layer Ti/TiN film 104 functions as an anti-reflective film at the time of interconnection patterning. The under layer Ti/TiN film 102 is provided to improve tolerance to stress migration and electric migration of the aluminum interconnection.

Aluminum interconnections 103 are covered with an insulating film (hereinafter, also referred to as "HDP insulating film") 106 formed by HDP-CVD. Formed on HDP insulating film 106 is an insulating film 107, which is deposited by a method other than HDP-CVD. Formation of insulating film 107 by HDP-CVD would cause damage to the insulating film 106, since sputtering is carried out at the same time as film deposition during HDP-CVD, as will be described later.

According to the manufacturing method as described above, at the time of interconnection patterning, the Ti/TiN films project outward from the sidewalls of the aluminum interconnections, due to their different etching characteristics, so that eaves, or overhangs, are created. In the subsequent HDP-CVD, high-density plasma and substrate bias are utilized in combination. With strong directivity of the film species in a vertical direction, film deposition and sputtering are carried out simultaneously. Since the top layer Ti/TiN film has the overhangs projecting outward from the upper edges of the aluminum interconnection, voids are likely to occur beneath the overhangs (in the areas denoted by "D" in FIG. 7), resulting in insufficient gap filling. In addition, during the HDP-CVD, the aluminum interconnection tends to suffer deformation due to the sputtering. It is highly possible that a crack or chip appears on the aluminum interconnection, e.g., in the area denoted by "E" in FIG. 7.

SUMMARY OF THE INVENTION

An object of the present invention is to provide a semiconductor device and a manufacturing method thereof by which, when filling an insulating film between interconnections by HDP-CVD, even if a Ti/TiN film serving as an anti-reflective film at the time of interconnection patterning is projecting from upper edges of each interconnection, voids beneath such overhangs as well as chips or cracks in the interconnections are prevented.

The manufacturing method of a semiconductor device according to an aspect of the present invention includes the steps of: forming semiconductor elements on a semiconductor substrate; forming on the semiconductor elements a plurality of interconnections side by side for electrically connecting the semiconductor elements with each other, each interconnection having a top protective layer on top surface thereof; forming a protective insulating film, by chemical vapor deposition (CVD) other than high density plasma-chemical vapor deposition (HDP-CVD), to cover top and side surfaces of the interconnections and a bottom surface of a gap between the interconnections; and forming an insulating film, by HDP-CVD, to cover the protective insulating film as well as to fill in the gap between the interconnections covered with the protective insulating film.

With this method, even if the top protective layer is projecting outward from the upper edges of the interconnection, it is possible to use CVD, with characteristic small directivity in the vertical direction, to deposit the protective insulating film without voids beneath such overhangs. In addition, even if the temperature increases during the film deposition by HDP-CVD, the protective insulating film covering the interconnections prevents cracking or chipping thereof due to such temperature increase.

CVD other than HDP-CVD includes parallel plate type plasma CVD, thermal CVD, and others. Assuming that the semiconductor elements are semiconductor element regions formed in the semiconductor substrate, the interconnections may be formed on the semiconductor substrate in contact therewith, or they may be formed on an upper-level, interlayer insulating film in contact therewith. A Ti/TiN film, for example, may be employed as the top protective layer.

In the step of forming the protective insulating film in the method of the present invention, at least one of $SiO_2$ film, SiON film, $Si_3N_4$ film and fluorine-containing $SiO_2$ film may be formed as the protective insulating film using TEOS (Tetra-Ethyl-Ortho-Silicate) as a raw material.

With this configuration, it is possible to cover the interconnections with the protective insulating film exhibiting excellent coverage quality.

In the relevant step of forming the protective insulating film, the protective insulating film is preferably deposited at a temperature of not greater than 400° C.

With this configuration, even if the interconnections are made of aluminum, cracking or chipping of the aluminum is prevented.

In the step of forming the insulating film by HDP-CVD in the method of the present invention, conditions on film deposition may be differentiated between its initial stage and the subsequent stage. Specifically, in the initial stage, the insulating film is deposited under a condition encouraging more intensive sputtering than in ordinary HDP-CVD. Thus, the film deposition proceeds while the protective insulating film covering the upper portions of the interconnections is sputter etched to widen the opening between the neighboring interconnections. In the subsequent stage, the insulating film is deposited under a condition allowing less intensive sputtering than in the initial stage.

With such a configuration, it is possible, without increasing the number of process steps, to fill in the gap between the interconnections while widening the opening narrowed by the formation of the protective insulating film. This prevents gap filling failure between the interconnections.

In the method of the present invention, the protective insulating film formed may be etched back before formation of the insulating film by HDP-CVD.

If the opening between the interconnections is blocked off by the protective insulating film, it is possible to etch back the protective insulating film to reopen the opening. Accordingly, the insulating film can be formed by HDP-CVD to successfully fill in the gap between the interconnections to the bottom. Of course, sputtering by HDP-CVD can accompany this etch back.

The step of forming the interconnections in the method of the present invention may include the step of forming a layer to be under protective layers located under the interconnections.

With this configuration, even if the interconnection is made of aluminum, for example, tolerance to stress migration and electric migration can be improved.

In the method of the present invention, the interconnection may be an aluminum interconnection.

With this configuration, it is possible to use a conventional facility to form the interconnection stably at a low price.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described in detail with reference to the drawings.

First Embodiment

Figure 1:
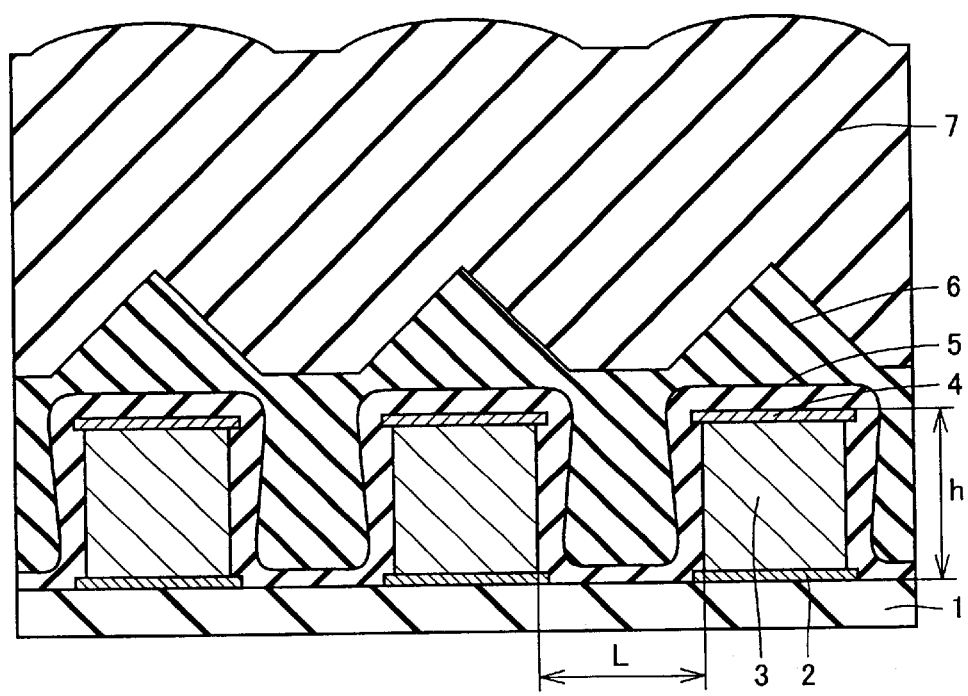
FIG. 1 is a cross sectional view of a semiconductor device according to a first embodiment of the present invention.

Referring to FIG. 1, an aluminum interconnection 3 is placed on an interlayer insulating film 1. Formed under aluminum interconnection 1 is a Ti/TiN film 2 as an "under protective layer". A Ti/TiN film 4 is placed on top of aluminum interconnection 1 as a "top protective layer". Ti/TiN film 2 as the under protective layer is for improving tolerance to stress migration and electric migration of the aluminum interconnection. Ti/TiN film 4 as the top protective layer functions as an anti-reflective film at the time of interconnection patterning. The aspect ratio (h/L) of a gap between neighboring interconnections 3 with top protective layers shown in FIG. 1 is not lower than 1.45. The interconnection width is not greater than 0.4 µm.

A thin insulating film 5 is formed to cover aluminum interconnection 3 with top and under protective layers 4, 2 as well as to cover interlayer insulating film 1. Thin insulating film 5 is deposited by CVD, exhibiting small directivity in the vertical direction, other than HDP-CVD. Thus, even if top protective layer 4 has both edges projecting outward from the sidewalls of the interconnection, it is possible to deposit the thin insulating film 5 without voids beneath the overhangs. An insulating film 6 is then formed by HDP-CVD to cover thin insulating film 5 as well as to fill in the gap between the interconnections. Yet another insulating film 7 is formed by CVD other than HDP-CVD on the HDP insulating film 6.

The deposition temperature when depositing thin insulating film 5 by CVD other than HDP-CVD to cover the aluminum interconnections is not higher than 400° C. Thin insulating film 5 has a film thickness on the order of 50–100 nm. Restricting the deposition temperature not to exceed 400° C. prevents fracture due to deformation of the aluminum interconnection, which would otherwise occur during the deposition of thin insulating film 5. The aluminum interconnection is covered by the thin insulating film 5 prior to deposition of insulating film 6 by HDP-CVD, so that aluminum fracture due to deformation of the aluminum interconnection because of the temperature increase during the deposition by HDP-CVD is suppressed. As the thin insulating film 5, $SiO_2$, SiON, SiN or FSG film, having TEOS excellent in step coverage as a raw material, may be employed alone or in any combination. Formation of such an insulating film with excellent step-covering property suppresses occurrence of voids and thus ensures successful filling beneath the overhangs of Ti/TiN film 4.

Second Embodiment

Figure 2:
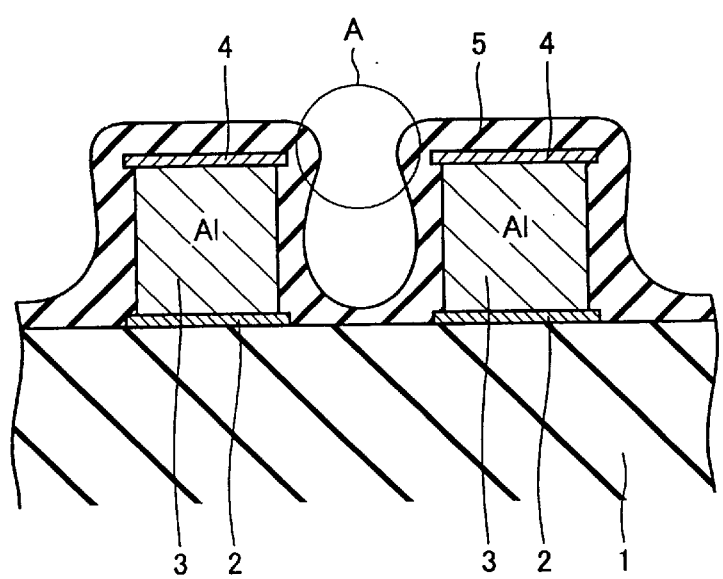
FIG. 2 is a cross sectional view illustrating a step in a semiconductor device manufacturing method according to a second embodiment of the present invention, wherein a protective insulating film formed has narrowed a distance between opposing upper edges of neighboring interconnections.
Figure 3:
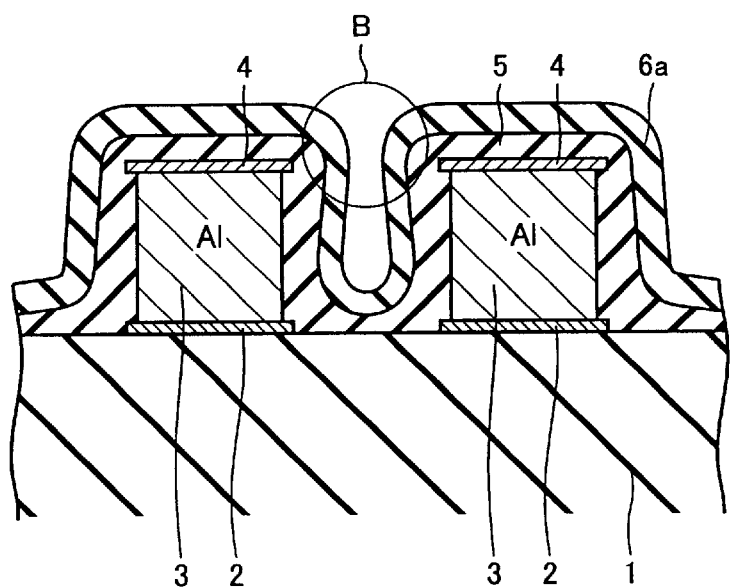
FIG. 3 is a cross sectional view illustrating an early stage of film deposition by HDP-CVD, wherein sputtering is effected with respect to the protective insulating film 5 shown in FIG. 2.
Figure 4:
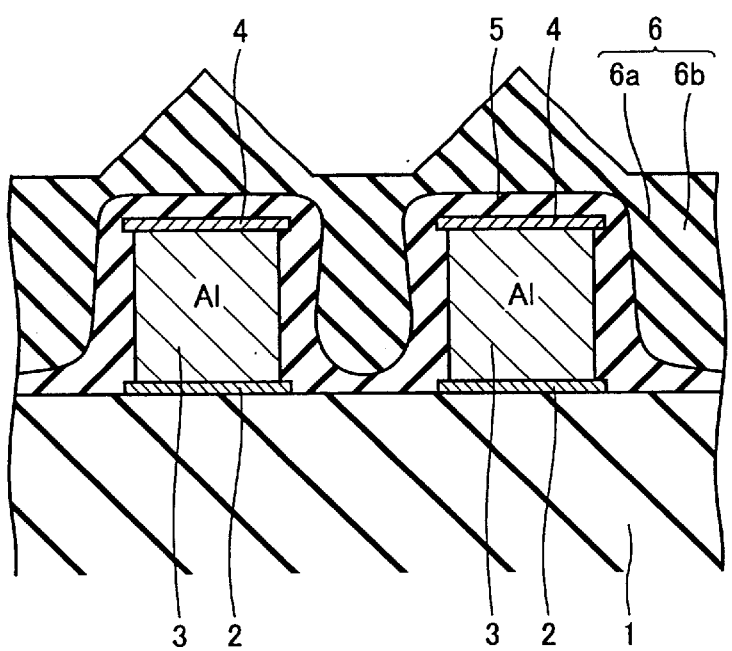
FIG. 4 is a cross sectional view showing a state after completion of a latter stage of the film deposition, following the stage shown in FIG. 3, wherein sputtering is alleviated.

FIGS. 2–4 illustrate the manufacturing method of the semiconductor device according to the second embodiment. When the insulating film covering the aluminum interconnection is being formed by CVD other than HDP-CVD as described above, the film thus formed on a sidewall of the interconnection will become thicker at an upper portion of the sidewall and thinner at the lower portion thereof FIG. 2 shows a state where the film thickness of the insulating film at the upper portion of the sidewall has become thicker than that at the lower portion of the sidewall, so that a distance, or opening between the opposing upper edges of the neighboring interconnections has become small. It would be difficult to fill in the space between the interconnections through such a narrow opening as shown in the area denoted by "A" in FIG. 2.

To overcome such a problem, insulating film 6 is deposited by HDP-CVD in a step consisting of multiple stages. Such a multi-stage deposition prevents insufficient filling of the insulating film in the space between the interconnections.

Specifically, the initial stage of deposition of HDP insulating film 6 is conducted under a condition allowing intensive sputtering. Thus, as shown in FIG. 3, film 5 on the upper edges of the interconnections are etched away, and those etched away are introduced into and deposit on the bottom of the space between the interconnections. In this initial stage of deposition, the opening between the interconnections widens, as shown in the area denoted by "B" in FIG. 3. At the same time, deposition by HDP-CVD advances and the insulating film 6a is formed. As such, widening of the opening between the upper portions of the neighboring interconnections and the film deposition at the bottom of the gap therebetween proceed simultaneously. Thereafter, the latter stage of deposition of HDP insulating film 6 is conducted under a condition allowing less intensive sputtering than in the initial stage, so that the insulating film 6b is deposited, as shown in FIG. 4. Accordingly, it is possible to form an insulating film without voids between the aluminum interconnections efficiently in a shorter processing time.

Third Embodiment

Figure 5:
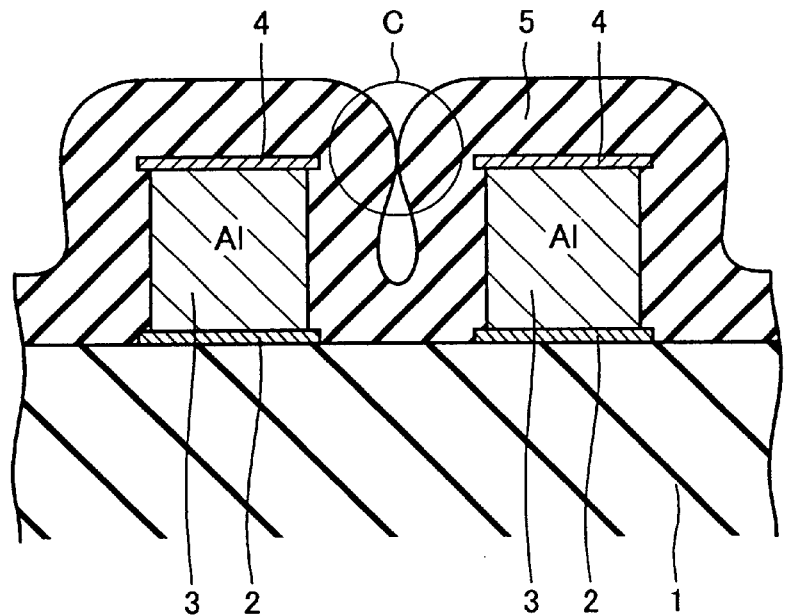
FIG. 5 is a cross sectional view illustrating a step in a semiconductor device manufacturing method according to a third embodiment of the present invention, wherein a protective insulating film formed has blocked off an opening between neighboring interconnections.
Figure 6:
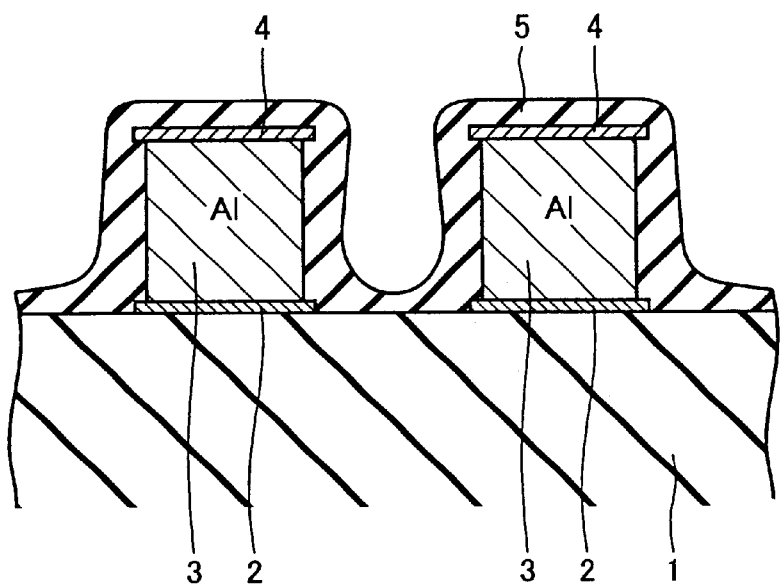
FIG. 6 is a cross sectional view showing a state where etch back has been effected to reopen the opening between the interconnections shown in FIG. 5.
Figure 7:
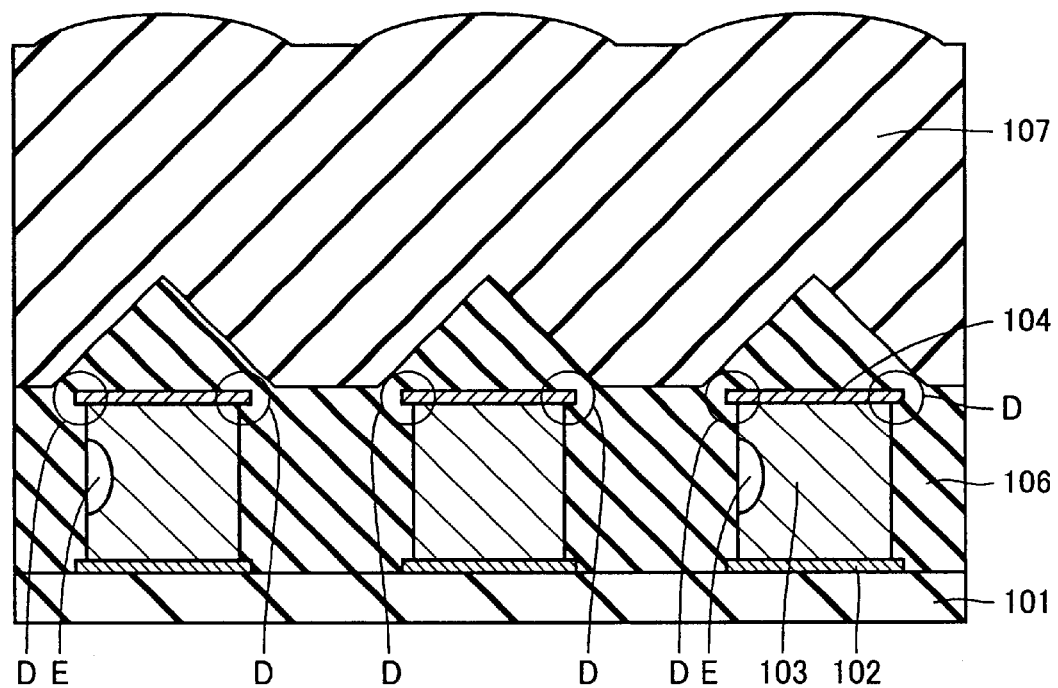
FIG. 7 is a cross sectional view showing a conventional semiconductor device.

FIGS. 5 and 6 illustrate the manufacturing method of the semiconductor device according to the third embodiment. There is a case where the protective, thin insulating film 5 deposited as described above blocks off the opening between the neighboring interconnections, as shown in FIG. 5. In such a case, the insulating film 5 may be etched back to ensure the opening between the interconnections prior to filling of the insulating film by HDP-CVD. Accordingly, an insulating film without voids can be formed.

In the embodiments above, the structure having a layer of aluminum interconnections and an interlayer insulating film has been explained. However, the present invention is of course applicable to a configuration having two or more such structures stacked one on another.

Although the present invention has been described and illustrated in detail, it is clearly understood that the same is by way of illustration only and is not to be taken by way of limitation, the spirit and scope of the present invention being limited only by the terms of the appended claims.

What is claimed is:

1. A manufacturing method of a semiconductor device, comprising the steps of:
    forming semiconductor elements on a semiconductor substrate;
    forming on said semiconductor elements a plurality of interconnections side by side for electrically connecting said semiconductor elements to each other, each said interconnection having a top protective layer on top surface thereof;
    forming a protective insulating film by chemical vapor deposition other than high density plasma chemical vapor deposition, to cover top and side surfaces of said interconnections and a bottom surface of a gap between said interconnections; and
    forming an insulating film by high density plasma chemical vapor deposition, to cover said protective insulating film and to fill in the gap between said interconnections covered with said protective insulating film.

2. The manufacturing method of a semiconductor device according to claim 1, wherein the step of forming said protective insulating film includes the step of forming, as said protective insulating film, at least one of $SiO_2$ film, SiON film, $Si_3N_4$ film and fluorine-containing $SiO_2$ film, with tetra-ethyl-ortho-silicate as a raw material, by the chemical vapor deposition other than high density plasma chemical vapor deposition.

3. The manufacturing method of a semiconductor device according to claim 1, wherein the protective insulating film is deposited at a temperature of not greater than 400° C.

4. The manufacturing method of a semiconductor device according to claim 1, wherein the step of forming the insulating film by the high density plasma chemical vapor deposition includes the step of depositing, in an initial stage, said insulating film under a condition encouraging more intensive sputtering than in ordinary high density plasma chemical vapor deposition, such that said protective insulating film on said interconnections is sputtered to widen an opening between said interconnections, and, in a subsequent stage, depositing said insulating film under a condition allowing less intensive sputtering than in said initial stage.

5. The manufacturing method of a semiconductor device according to claim 1, wherein, after the step of forming the protecting insulating film, said protective insulating film is etched back prior to the step of forming the insulating film by the high density plasma chemical vapor deposition.

6. The manufacturing method of a semiconductor device according to claim 1, wherein the step of forming said interconnections includes the step of depositing a layer to be under protective layers located under said interconnections.

* * * * *